(12) United States Patent
Imai et al.

(10) Patent No.: US 8,013,410 B2
(45) Date of Patent: Sep. 6, 2011

(54) IMAGING DEVICE, METHOD FOR MANUFACTURING THE IMAGING DEVICE AND CELLULAR PHONE

(75) Inventors: Makoto Imai, Kanagawa (JP); Hiroshi Nishizawa, Kanagawa (JP)

(73) Assignee: Panasonic Corporation, Osaka (JP)

( * ) Notice: Subject to any disclaimer, the term of this patent is extended or adjusted under 35 U.S.C. 154(b) by 193 days.

(21) Appl. No.: 12/443,508

(22) PCT Filed: Oct. 4, 2007

(86) PCT No.: PCT/JP2007/069431
§ 371 (c)(1),
(2), (4) Date: Mar. 30, 2009

(87) PCT Pub. No.: WO2008/041739
PCT Pub. Date: Apr. 10, 2008

(65) Prior Publication Data
US 2010/0025789 A1 Feb. 4, 2010

(30) Foreign Application Priority Data
Oct. 5, 2006 (JP) .................. 2006-274211

(51) Int. Cl.
*H01L 31/0232* (2006.01)
*H01L 31/0203* (2006.01)
*H01L 21/50* (2006.01)

(52) U.S. Cl. ........... 257/432; 257/E31.11; 257/E21.499; 257/E31.127; 438/64; 438/65

(58) Field of Classification Search .......... 257/432
See application file for complete search history.

(56) References Cited

U.S. PATENT DOCUMENTS

| | | | | |
|---|---|---|---|---|
| 6,122,009 A * | 9/2000 | Ueda | ............ | 348/335 |
| 6,486,917 B2 * | 11/2002 | Iwasaki | ............ | 348/375 |
| 6,489,992 B2 * | 12/2002 | Savoye | ............ | 348/340 |
| 7,349,626 B2 * | 3/2008 | Nishizawa | ............ | 396/275 |
| 7,507,944 B1 * | 3/2009 | Arnzen et al. | ............ | 250/208.1 |
| 7,534,059 B2 | 5/2009 | Nishizawa | | |
| 2003/0094665 A1 * | 5/2003 | Harazono | ............ | 257/432 |
| 2003/0112714 A1 * | 6/2003 | Harazono | ............ | 369/18 |
| 2004/0222352 A1 * | 11/2004 | Nishizawa | ............ | 250/208.1 |
| 2005/0030408 A1 * | 2/2005 | Ito et al. | ............ | 348/340 |
| 2005/0270403 A1 * | 12/2005 | Adachi et al. | ............ | 348/340 |
| 2006/0011811 A1 * | 1/2006 | Hsin et al. | ............ | 250/208.1 |
| 2006/0186492 A1 * | 8/2006 | Boettiger et al. | ............ | 257/414 |
| 2007/0030334 A1 * | 2/2007 | Nishizawa | ............ | 347/245 |

FOREIGN PATENT DOCUMENTS

CN 1799254 A 7/2006
JP 2005-27155 A 1/2005

* cited by examiner

*Primary Examiner* — N Drew Richards
*Assistant Examiner* — Robert Carpenter
(74) *Attorney, Agent, or Firm* — Pearne & Gordon LLP

(57) ABSTRACT

An imaging device includes a lens (3), an optical filter (5), a semiconductor imaging element (4) having a light receiving section, and a tridimensional substrate (2) on which the semiconductor imaging element (4) and the optical filter (5) are mounted, wherein the tridimensional substrate (2) has an opening (14) corresponding to the light receiving section of the semiconductor imaging element (4), the semiconductor imaging element (4) and the optical filter (5) are located on one side of the opening (14), the lens (3) is located on the other side of the opening (14), and the semiconductor imaging element (4) and the optical filter (5) are fixed to the tridimensional substrate (2) under the condition that the semiconductor imaging element (4) and the optical filter (5) are curved, and have respective centers moved in a direction away from the lens (3).

7 Claims, 9 Drawing Sheets (a)

(b)

(a)

(b)

IMAGING DEVICE, METHOD FOR MANUFACTURING THE IMAGING DEVICE AND CELLULAR PHONE

TECHNICAL FIELD

The present invention relates to a thin model imaging device to be installed in a camera-equipped mobile device, and more particularly to an imaging device which can take an image improved in the quality of its peripheral portion.

BACKGROUND OF THE INVENTION

In general, a small imaging device installed in a camera-equipped mobile device has disadvantages such as for example field curvature by which a peripheral portion of an image taken by the small imaging device reduced in thickness along its optical axis is blurred, and shading by which the amount of light received from an object is degraded in a peripheral portion of the semiconductor imaging element. In order to correct the above-mentioned field curvature and shading, a semiconductor imaging element is curved by a concave-shaped package, or attached to and curved by an actuator in the conventional imaging device (refer to for example patent documents 1 to 4). The conventional imaging device provided with a semiconductor imaging element curved by the concave-shaped package, or attached to the actuator is increased in thickness along its optical axis, and in weight.

A conventional imaging device provided with a semiconductor imaging element curved without a package or an actuator is disclosed in a patent document 5. In this device, a semiconductor imaging element is fixed, under high temperature, to one side of a substrate different in thermal expansion coefficient from the semiconductor imaging element, and curved, under the normal operation temperature range, by a stress resulting from the difference in thermal expansion coefficient between the semiconductor imaging element and the substrate. A lens and an optical filter made of glass or the like are disposed on the other side of the substrate. The optical filter prevents infrared light from being received by the semiconductor imaging element.

In general, the thermal expansion coefficient of glass is larger than that of silicon for the semiconductor imaging element, and smaller than that of glass epoxy material for the substrate. The semiconductor imaging element is fixed to one side of the substrate under high temperature, while the optical filter is fixed to the other side of the substrate under high temperature. As a result, the optical filter has a center portion curved in a direction toward the lens under the normal operation temperature range, while the semiconductor imaging element has a center portion curved in a direction away from the lens. Here, a reflection-type optical filter is characterized in that a half-value wavelength, i.e., a wavelength at which its transmission decreases to 50%, shifts toward shorter wavelengths when an incident angle of light to the optical filter is increased.

Patent document 1: Japanese Patent Laid-Open Publication 2003-244558
Patent document 2: Japanese Patent Laid-Open Publication 2001-156278
Patent document 3: Japanese Patent Laid-Open Publication 2004-297683
Patent document 4: Japanese Patent Laid-Open Publication 2005-278133
Patent document 5: Japanese Patent Laid-Open Publication 2004-146633

DISCLOSURE OF THE INVENTION

Problems to be Solved by the Invention

The conventional imaging device disclosed in the patent document 5, however, encounters such a problem that, as a result of the fact that an incident angle of light to the optical filter curved in a direction toward the lens increases with distance from the center of the optical filter, a peripheral portion of an image is reduced in color reproduction.

It is therefore an object of the present invention to provide a thin model imaging device which can take an image improved in color reproduction at the periphery of the image.

Means For Solving the Problems

The imaging device according to the present invention comprises: a lens; an optical filter; a semiconductor imaging element having a light receiving section; and a substrate on which the semiconductor imaging element and the optical filter are mounted, wherein the substrate has an opening corresponding to the light receiving section of the semiconductor imaging element, the semiconductor imaging element and the optical filter are located on one side of the opening, while the lens is located on the other side of the opening, the semiconductor imaging element and the optical filter are fixed to the substrate under the condition that the semiconductor imaging element and the optical filter are curved, and have respective centers moved in a direction away from the lens.

The imaging device is constituted as a thin model imaging device, and can prevent curvature of field, shading, and color reproduction from being deteriorated at the periphery of the image, by reason that the semiconductor imaging element and the optical filter are curved in the same direction under the normal operation temperature range.

In the imaging device according to the present invention, the substrate may have a thermal expansion coefficient larger than that of the semiconductor imaging element, and larger than that of the optical filter.

The imaging device thus constructed is improved in thickness and weight without having a retaining member by reason that the semiconductor imaging element is curved under the normal operation temperature range by a stress resulting from the difference in thermal expansion coefficient between the semiconductor imaging element and the substrate.

In the imaging device according to the present invention, the semiconductor imaging element and the optical filter may be mounted on the substrate at a temperature higher than the normal operation temperature range.

In the imaging device thus constructed, it is easy to mount the semiconductor imaging element and the optical filter on the substrate by using the difference between the normal operation temperature range of the imaging device and a production temperature at which the semiconductor imaging element and the optical filter are mounted on the substrate. The semiconductor imaging element and the optical filter are in a planar state at the production temperature. On the other hand, the semiconductor imaging element and the optical filter are in a curved state within the normal operation temperature range.

In the imaging device according to the present invention, the optical filter may have surfaces each provided with dielectric multilayer film.

The imaging device thus constructed can be improved in weight by reason that the optical filter made of glass is reduced in thickness.

In the imaging device according to the present invention, the semiconductor imaging element may be mounted on the substrate on the basis of a flip chip bonding method.

In the imaging device thus constructed, an area occupied by the semiconductor imaging element mounted on the substrate can be small by reason that the semiconductor imaging element is mounted on the substrate, with its face down, without being retained by a retaining member. Therefore, the imaging device according to the present invention can be reduced in size in comparison with the conventional imaging device.

In the imaging device according to the present invention, a peripheral portion of the optical filter may be fixed to the substrate with an adhesive.

In the imaging device thus constructed, the amount of curve at diagonal corners of the optical filter is larger than that of the center portion of the optical filter. Therefore, the image can be improved in color reproduction at the periphery of the image.

The imaging device according to the present invention comprises: a lens; an optical filter; a semiconductor imaging element having a light receiving section; and a substrate on which the semiconductor imaging element and the optical filter are mounted, wherein the substrate has an opening corresponding to the light receiving section of the semiconductor imaging element, the semiconductor imaging element and the optical filter are located on one side of the opening, while the lens is located on the other side of the opening, the semiconductor imaging element and the optical filter are mounted on the substrate at a temperature higher than the normal operation temperature range.

As a result of the fact that the semiconductor imaging element and the optical filter are fixed to the substrate at the same high temperature, and cooled to the normal operation temperature range, the semiconductor imaging element and the substrate are curved within the normal operation temperature range with stability and accuracy. Therefore, the imaging device according to the present invention can reduce piece-to-piece variations of imaging characteristics.

In accordance with further aspect of the present invention, there is provided a method of manufacturing an imaging device, comprising: a step of preparing a substrate and a semiconductor imaging element having a light receiving section; a step of mounting the semiconductor imaging element on the substrate; a step of applying thermosetting adhesive to a peripheral portion of the light receiving section; and a step of having the thermosetting adhesive cure at a temperature higher than the normal operation temperature range.

The method according to the present invention can prevent curvature of field and shading from being deteriorated at the periphery of image by reason that the semiconductor imaging element are curved under the normal operation temperature range by using the difference between the thermal expansion coefficient of the substrate and the thermal expansion coefficient of the semiconductor imaging element, the difference between the normal operation temperature range of the imaging device and the cure temperature of the thermosetting adhesive.

The method according to the present invention may further comprise: a step of preparing thermosetting adhesive which cures at a temperature higher than the normal operation temperature range before mounting the semiconductor imaging element on the substrate; and a step of mounting an optical filter on the substrate by using the thermosetting adhesive.

Therefore, the optical filter is mounted on the substrate, and covers the opening of the substrate in the imaging device according to the present invention. The semiconductor imaging element is mounted on the substrate strengthened by the optical filter with stability and efficiency.

The mobile phone may comprise an imaging device according to the present invention.

The mobile phone can be improved in thickness and weight by reason that the thin model imaging device manufactured on the basis of the method according to the present invention is installed in the mobile phone. The thin model imaging device according to the present invention can enhance the usefulness of the mobile phone by reason that the thin model imaging device according to the present invention can enhance the quality of an image by reducing optical aberration.

The mobile phone may comprise an imaging device manufactured on the basis of the method according to the present invention.

The mobile phone can be improved in thickness and weight by reason that the thin model imaging device manufactured on the basis of the method according to the present invention is installed in the mobile phone. The thin model imaging device according to the present invention can enhance the usefulness of the mobile phone by reason that the thin model imaging device according to the present invention can enhance the quality of an image by reducing optical aberration.

ADVANTAGEOUS EFFECT OF THE INVENTION

The present invention is to provide a thin model imaging device having the following advantages. First, field curvature and shading of a semiconductor imaging device is reduced by mounting an optical filter and a semiconductor device on a substrate so that both of them are curved toward the same direction. Second, color reproduction of the periphery of an image can be improved by reducing incident angle of incident light around the periphery of the optical filter.

EXPLANATION OF THE REFERENCE NUMERALS

Figure 1:
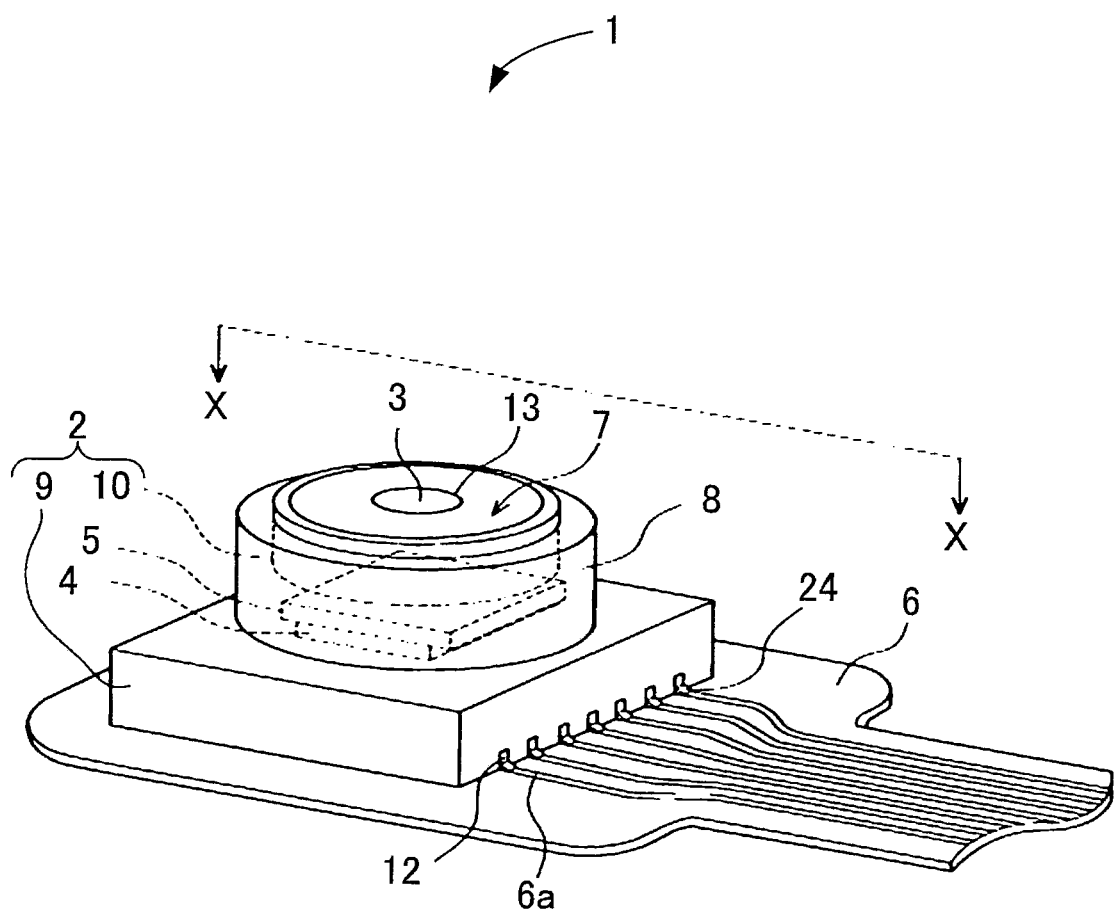
FIG. 1 is a perspective view of an imaging device according to the first embodiment of the present invention.

1: imaging device
2: tridimensional substrate
3: lens
3a, 3b: aspheric lens
4: semiconductor imaging element
4a: pad
5: optical filter
6: FPC
6a: connecting land
7: lens holder
7a: screw
8: arrangement ring
8a: screw
9: pedestal section
10: lens tube section
11: partition wall
12: terminal section
13: opening
14: opening
15: first planar section
16: second planar section
17: solder
19: sealant
21: bump
22: Ag paste
23: adhesive
25: wiring pattern
27: metal foil
30: mobile phone
31: upper case
32: lower case
33: hinge
34: display
35: loudspeaker
36: antenna
38: input key
38a: imaging key
39: microphone
41: imaging device
52: tridimensional substrate
54: semiconductor imaging element
55: optical filter
61: partition wall

PREFERRED EMBODIMENTS OF THE INVENTION

The first and second embodiments of an imaging device according to the present invention will be described hereinafter with reference to accompanying drawings.

First Embodiment

The imaging device according to the first embodiment of the present invention will now be described hereinafter with reference to FIGS. 1 to 8.

As shown in FIG. 1, the imaging device 1 according to the first embodiment comprises a tridimensional substrate 2 made of polyphthalamide resin (PPA), a lens 3, a semiconductor imaging element 4 having a light receiving section arranged in the center and not shown in the figure, an optical filter 5 for eliminating infrared light without having infrared light passed therethrough, a flexible printed circuit (simply referred to as "FPC") 6, a lens holder 7, and an arrangement ring 8.

The tridimensional substrate 2 has a pedestal section 9 and a lens tube section 10. In order to enhance the lightproof function of the tridimensional substrate 2, it is preferable that the tridimensional substrate 2 be made of black PPA. As a result of the fact that the tridimensional substrate 2 is provided with hydrous magnesium silicate (hereinafter simply referred to as "talc") including, as main components, silicon dioxide ($SiO_2$) and magnesium oxide (MgO), the thermal expansion coefficient of the tridimensional substrate 2 reaches a specific value. In this embodiment, the thermal expansion coefficient of the tridimensional substrate 2 is around $18 \times 10^{-6}/°$ C.

The lens 3 is fitted into the lens holder 7 formed with an opening 13. The lens holder 7 is fixed to the lens tube section 10 by the arrangement ring 8 located around the lens holder 7.

Figure 2:
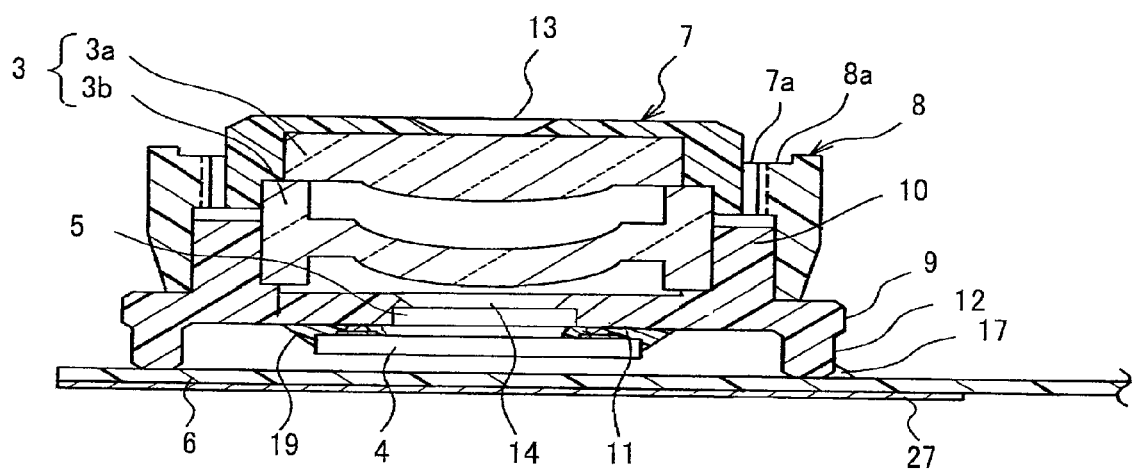
FIG. 2 is a cross-section view taken along a line drawn from X to X shown in FIG. 1.

The pedestal section 9 has terminal sections 12 electrically connecting an inside portion of the tridimensional substrate 2 to an outside portion of the tridimensional substrate 2. As shown in FIG. 2, the terminal sections 12 are respectively connected to connecting lands 6a of the FPC 6 with solder 17.

A portion of the pedestal section 9 and a portion of the lens tube section 10 collectively constitute a partition wall 11. The center portion of the partition wall 11 has an opening 14 having the shape of a rectangle corresponding to the semiconductor imaging element 4. The upper surface of the partition wall 11 is parallel to the lower surface of the partition wall 11.

The partition wall 11 is provided with a first planar section 15 on which the optical filter 5 is located, while the pedestal section 9 is provided with a second planar section 16 on which the semiconductor imaging element 4 is located.

Here, the semiconductor imaging element 4 and the optical filter 5 are located on one side of the opening 14. The lens 3 is located on the other side of the opening 14.

A wiring pattern 25 formed on a surface of the pedestal section 9 in an electroless plating process is electrically connected to the terminal sections 12. The semiconductor imaging element 4 is mounted on the surface of the pedestal section 9.

The semiconductor imaging element 4 is constituted by ¼-inch UXGA CCD or CMOS having for example two million pixels, and mounted on the second planar section 16 in a flip-chip bonding process. In this embodiment, the semiconductor imaging element 4 is mounted on the pedestal section 9 without a holding member disclosed in the patent documents 1 to 4, and without a package. Therefore, the semiconductor imaging element 4 is curved by a stress through the pedestal section 9 as will be described hereinafter.

In this embodiment, the semiconductor imaging element 4 is mounted on the pedestal section 9, on the basis of a stud bump bonding (SBB) method, through gold bump and conductive Ag paste (hereinafter simply referred to as "Ag paste") given to the end of the bump. However, the semiconductor imaging element 4 may be mounted on the pedestal section 9 on the basis of a ball grid array (BGA) method or the like.

Figure 3:
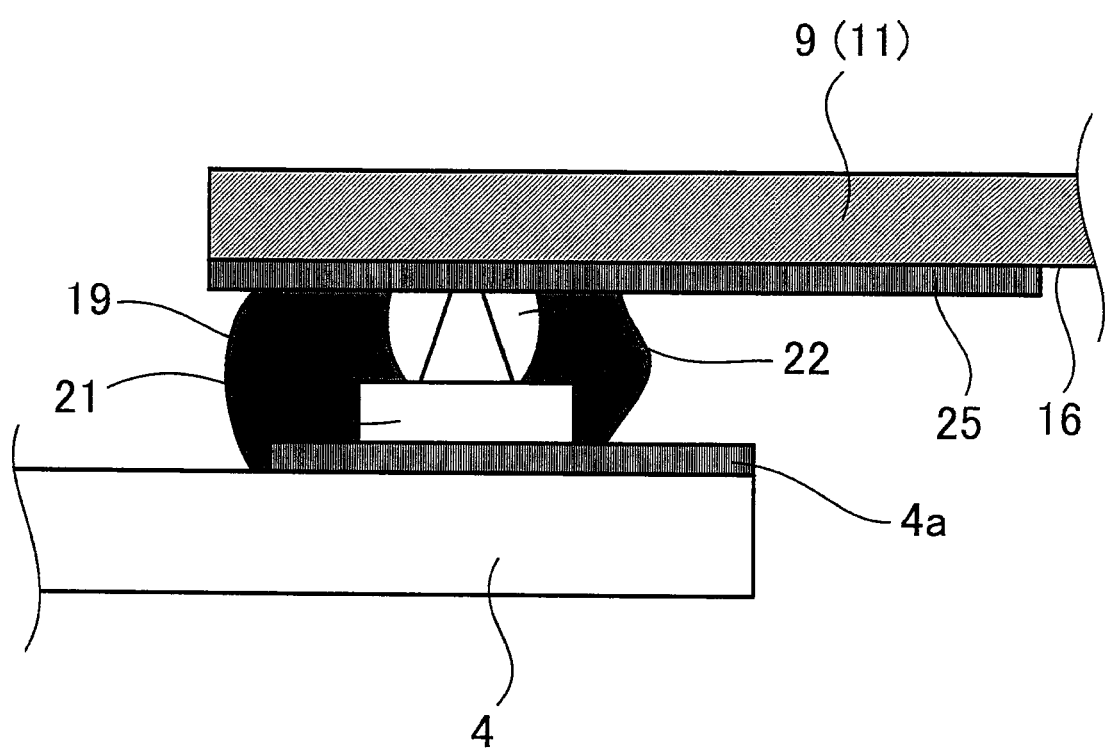
FIG. 3 is a cross-section view of a pedestal section of the imaging device according to the first embodiment of the present invention.

The semiconductor imaging element 4 is made of mono crystalline silicon on the basis of well-known semiconductor process. As shown in FIG. 3, the semiconductor imaging element 4 has a peripheral circuit located around a light receiving section, and not shown in the figures. The peripheral circuit has wiring pads 4a, an optical black section constituted by optically-shielded pixels, an analog-to-digital converter (ADC), a timing generator, and the like. The semiconductor imaging element 4 is constituted as one chip sensor measuring 4.9 [mm] by 6.5 [mm].

The light receiving section measures 2.7 [mm] by 3.6 [mm], and has square pixels aligned on the basis of Bayer arrangement method, each of the pixels measuring 2.25 [μm] by 2.25 [μm].

The pad 4a has a bump 21 made of Au and formed by an Au wire or capillary. The bump 21 has a thin tip section coated with the Ag paste 22.

The second planar section 16 has a wiring pattern 25 formed thereon. A part of the wiring pattern 25 is electrically connected to the bump 21 through the Ag paste 22. The peripheral area of the bump 21 is fixed and sealed with a sealant 19.

The sealant 19 is constituted by epoxy adhesive, and provided with an initiator for starting curing with heat or ultraviolet light.

An imaging signal produced by the semiconductor imaging element 4 and chip components not shown in the figures and mounted on and the tridimensional substrate 2 is output to an outer circuit through the wiring pattern 25 and the connecting lands 6a of the FPC 6. Similarly, a control signal and an electric power are supplied to the semiconductor imaging element 4 and the chip components from an outside circuit through the wiring pattern 25 and the connecting lands 6a of the FPC 6.

A metal foil 27 is attached to the rear side of the FPC 6. Therefore, visible light and infrared light from the outside of the tridimensional substrate 2 do not pass through the metal foil 27, and do not reach the back side of the semiconductor imaging element 4.

The lens 3 is constituted by two aspheric lenses 3a and 3b which are different in optical characteristics from each other. The aspheric lenses 3a and 3b are fitted into the lens holder 7, and located at a predetermined interval. Here, the lens holder 7 has an outer circumferential portion formed with a screw 7a. The arrangement ring 8 has an inner circumferential portion formed with a screw 8a to be meshed with the screw 7a of the lens holder 7. The position of the lens holder 7 can be changed in a direction of the axis of the lens holder 7.

The lens 3 is made of resin material which satisfies predetermined values regarding optical characteristics such as for example transmission and refraction. In the embodiment, Zeonex (registered trademark) produced by Zeon Corporation is used as the resin material. The lens 3 is constituted by a pan focus lens which enables an image of an object to be focused on the semiconductor imaging element 4 under the condition that the distance to the object is larger than a predetermined value. More specifically, the lens 3 is formed so that an image is focused for an object which located at a position which is far from around more than 30 [cm]. But, a material, compositions and characteristics of the lens 3 may not be limited described above, and may be changed depending on application of the imaging device 1.

The optical filter 5 is provided with a base member such as glass and a dielectric multilayer. The thermal expansion coefficient of the optical filter 5 is $7 \times 10^{-6}/°C$. The optical filter 5 has a surface provided with an infrared cut coat which prevents infrared light from passing through the optical filter 5, and a surface provided with an antireflection coat which prevents reflection from that surface.

The infrared cut coat is formed by evaporation of silicon dioxide ($SiO_2$) or titan oxide ($TiO_2$) onto one surface of the base member for example. On the other hand, the antireflection coat is formed by evaporation of aluminum trioxide ($Al_2O_3$), magnesium fluoride ($MgF_2$) or zirconium dioxide ($ZrO_2$) onto the other surface of the base member for example.

In order to allow the optical filter 5 to filter out ultraviolet light, it is preferable that the base member be made of glass. In this case, the optical filter 5 can filter out outside regions of visible light.

The optical filter 5 is fixed on the first planar section 15 with thermosetting adhesive 23 under the condition that the antireflection-coated surface of the optical filter 5 is in faced toward the lens 3. Here, it is preferable that the difference between the thermal curing temperature of the adhesive 23 and the thermal curing temperature of the sealant 19 be less than or equal to 30° C. It is also preferable that the difference between the glass transition temperature of the cured adhesive 23 and the glass transition temperature of the cured sealant 19 be less than or equal to 30° C.

Figure 4:
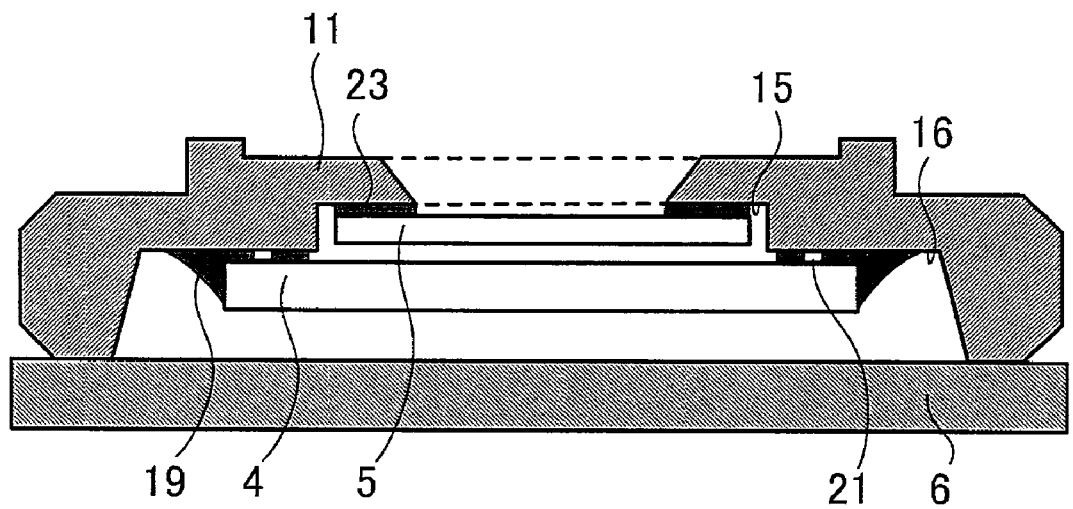
FIG. 4(a) is a cross-section view of a pedestal section and its surroundings of the imaging device of the first embodiment of the present invention under high temperature.
FIG. 4(b) is a cross-section view of a pedestal section and its surroundings of the imaging device of the first embodiment of the present invention under the normal operation temperature range.
Figure 4:
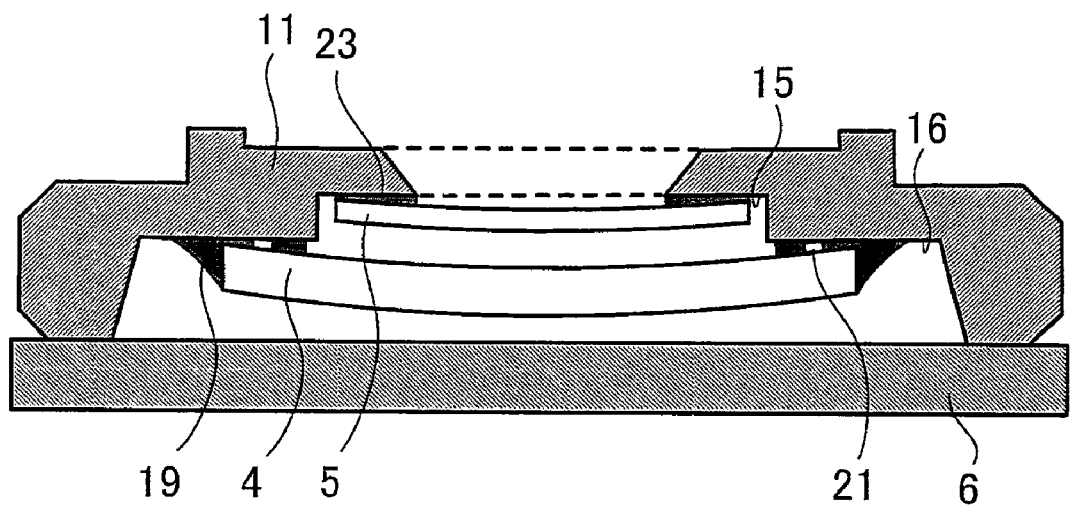

The construction of the tridimensional substrate 2, the semiconductor imaging element 4 and the optical filter 5 will be then explained hereinafter in detail with reference to FIG. 4.

FIG. 4(a) is a cross-section view of the pedestal section 9 of the tridimensional substrate 2 and its surroundings heated to a predetermined high temperature. FIG. 4(b) is a cross-section view of the pedestal section 9 of the tridimensional substrate 2 and its surroundings within the normal operation temperature range. Here, the normal operation temperature range ranges from 0° C. to 35° C. in this embodiment.

The optical filter 5 is mounted on the first planar section 15 with adhesive 23 which starts to cure at a temperature of 150° C. As shown in FIG. 4(a), each of the tridimensional substrate 2 and the optical filter 5 is in a planar state when the adhesive 23 starts to cure.

The peripheral portion of the optical filter 5 is adhered to the first planar section 15 of the tridimensional substrate 2, while the center portion of the optical filter 5 is not adhered to the center portion of the tridimensional substrate 2. The difference in length between the center portion of the tridimensional substrate 2 and the center portion of the optical filter 5 is caused when this assembly is cooled to the normal operation temperature range from the high temperature, and given by $(\alpha_{ti}-\alpha_{tg}) \times L \times \Delta t$. Here, the character "$\alpha_{ti}$" is intended to indicate a thermal expansion coefficient of the tridimensional substrate 2, the character "$\alpha_{tg}$" is intended to indicate a thermal expansion coefficient of the optical filter 5, the character "$\Delta t$" is intended to indicate the difference between the high temperature and the normal operation temperature range, and the character "L" is intended to indicate the length of a center portion of the optical filter 5. Therefore, the center portion of the optical filter 5 is curved toward the direction far from the opening 14 as shown in FIG. 4(b).

The semiconductor imaging element 4 is mounted on the second planar section 16 of the pedestal section 9 on the basis of a stud bump bonding (SBB) method by a sealant 19 which starts to cure at a temperature of 125° C. The semiconductor imaging element 4 cooled to the normal operation temperature range is deflexed by a stress resulting from the difference between the thermal expansion coefficient of the tridimensional substrate 2 and the thermal expansion coefficient of the partition wall 61, in a direction the same as a direction in which the optical filter 5 is deflexed.

Figure 5:
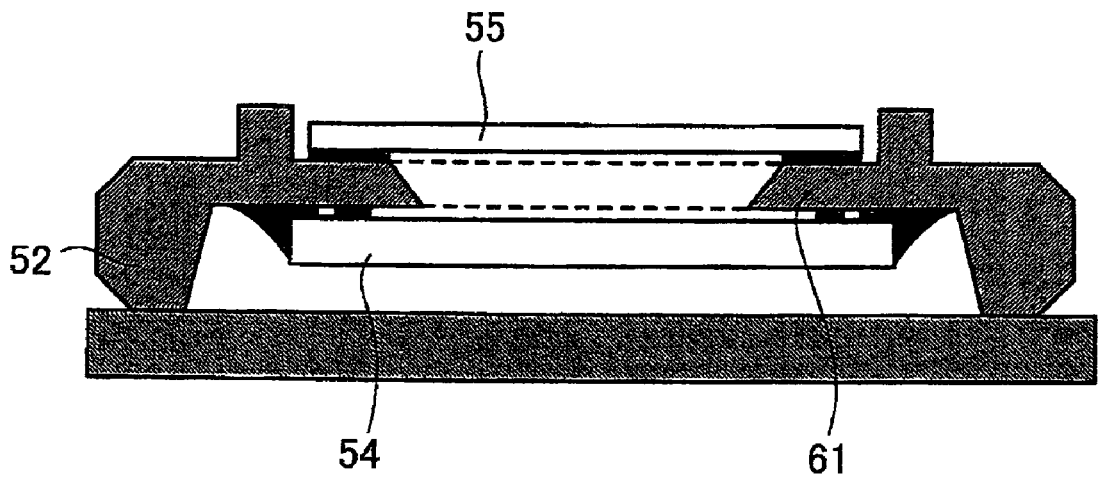
FIG. 5(a) is a cross-section view of the conventional imaging device under high temperature.
FIG. 5(b) is a cross-section view of the conventional imaging device under the normal operation temperature range.
Figure 5:
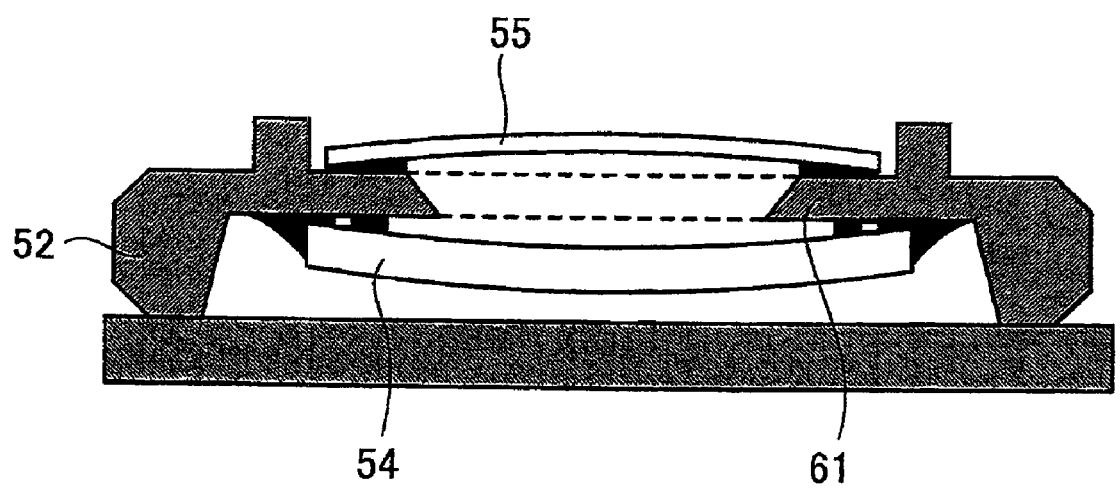

In FIG. 5, the tridimensional substrate 52, the semiconductor imaging element 54 and the optical filter 55 of the conventional imaging device are compared with those of the imaging device according to the present invention.

In the conventional imaging device, the optical filter 55 is attached to one side of the partition wall 61, and the semiconductor imaging element 54 is and attached to the other side of the partition wall 61. When the conventional imaging device is cooled to the normal operation temperature range from the high temperature, the semiconductor imaging element 54 is deflexed in a direction away from the optical filter 55, and the optical filter 55 is deflexed in a direction away from the semiconductor imaging element 54.

The operation of the imaging device 1 according to the first embodiment will be described hereinafter.

Firstly, light from an object passes through the opening 13, and is focused with the lens 3.

Next, the light focused with the lens 3 enters the optical filter 5. At this time, the optical filter 5 filters out infrared light and ultraviolet light components of the light.

Next, light passed through the optical filter 5 enters the semiconductor imaging element 4. In the semiconductor imaging element 4, the incident light passes through a micro lens and an on-chip lens not shown in the figure, passes through a pigment color filter, and enters photo diodes not shown in the figure.

Next, the light entered into the photo diodes is converted into an electric signal. This electric signal is outputted as an image signal to an outer device such as a monitor not shown in the figure through the wiring pattern 25, the terminal sections 12 and the FPC 6.

The image defined at an aspect ratio of 4:3 is displayed on a monitor at a rate of 30 frames per second.

Figure 6:
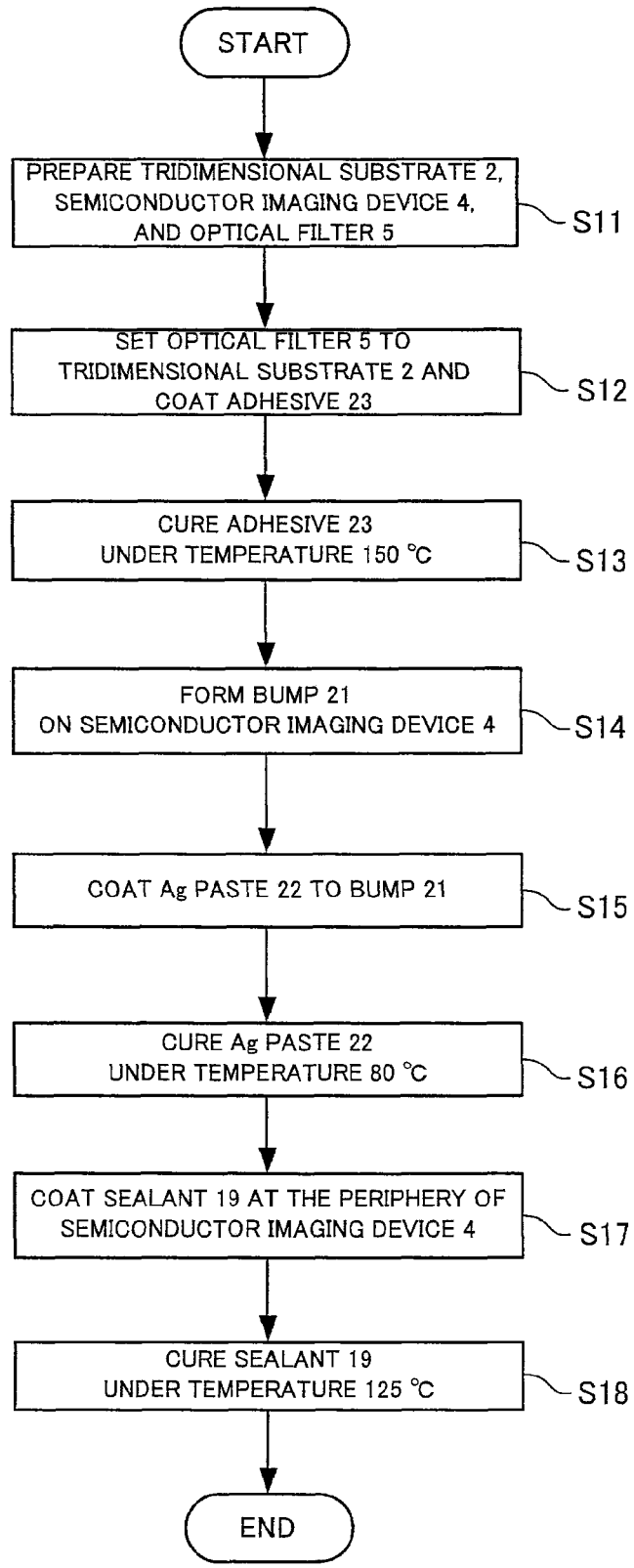
FIG. 6 is a flow chart for explaining a manufacturing process of the imaging device according to the first embodiment of the present invention.

A process of manufacturing the imaging device 1 according to the preferred embodiment of the present invention will be described hereinafter with reference to FIG. 6.

First, the tridimensional substrate 2, the semiconductor imaging element 4 and the optical filter 5 are prepared (in step S11). The tridimensional substrate 2 is filled with talc. Therefore, the thermal expansion coefficient of the tridimensional substrate 2 filled with talc is around $18 \times 10^{-6}/°$ C. The tridimensional substrate 2 is baked when the tridimensional substrate 2 has absorbed moisture.

Next, the optical filter 5 is set to the first planar section 15, and the epoxy adhesive 23 is coated around the periphery of the optical filter 5 with a dispenser (in step S12).

Next, the epoxy adhesive 23 cures when heated to a temperature of 150° C. (in step S13). This process avoids deformation of the tridimensional substrate 2 due to handling, making it possible to stably perform the following process.

The bump 21 is then formed on the pad 4a of the semiconductor imaging element 4 (in step S14). At this time, the bump 21 is strongly connected to the pad 4a made of aluminum as a result of the fact that an Au—Al alloy layer is formed at the connection area with friction heat.

The head end of the bump 21 is then thinned, and coated with Ag paste 22 (in step S15).

The bump 21 of the semiconductor imaging element 4 is then faced with the second planar section 16, and attached to the wiring pattern 25 of the second planar surface 16. The Ag paste 22 cures when heated to a temperature of 80° C. (in step S16).

The sealant 19 is then coated around the peripheral portion of the semiconductor imaging element 4 with a dispenser (in step S17). At this time, ultraviolet light through the opening 14 forms a dam for preventing the sealant 19 from flowing into the light receiving section from the peripheral portion of the semiconductor imaging element 4.

The sealant 19 cures when heated to a temperature of 125° C. (in step S18).

When the imaging device 1 manufactured through the above-mentioned process is cooled to the normal operation temperature, a stress is applied to the semiconductor imaging element 4 and the optical filter 5 in a direction the same as a direction in which the second planar section 16 is shrunk. Therefore, the second planar section 16 and the center portion of the optical filter 5 are deflexed by the stress resulting from the difference between the thermal expansion coefficient of the tridimensional substrate 2 and the thermal expansion coefficient of the partition wall 61 in a direction away from the lens 3.

In the imaging device 1 manufactured through the above-mentioned process, the thermal expansion coefficients of the tridimensional substrate 2, the optical filter 5, and the semiconductor imaging element 4 are expressed by a following expression.

Tridimensional substrate 2>Optical filter 5>Semiconductor imaging element 4

The optical filter 5 is fixed to the tridimensional substrate 2. Consequently, the thermal expansion coefficient of a portion around the opening 14 of the tridimensional substrate 2 is seemingly located between that of the tridimensional substrate 2 and that of the optical filter 5. Therefore, the difference in thermal expansion coefficient between the tridimensional substrate 2 and the optical filter 5 seemingly approaches the difference in thermal expansion coefficient between the tridimensional substrate 2 and the semiconductor imaging element 4. Further, the semiconductor imaging element 4 is fixed to the tridimensional substrate 2. Consequently, the semiconductor imaging element 4 fixed to the tridimensional substrate 2 and the optical filter 5 fixed to the tridimensional substrate 2 are almost the same in curved configuration as each other. Therefore, an angle of incident light from an object with respect to each of the semiconductor imaging element 4 and the optical filter 5 substantially becomes constant without depending on an image height. The imaging device 1 can take an image improved in color reproduction at the periphery of the image.

The optical characteristic of the imaging device 1 thus constructed will then be explained hereinafter with reference to FIGS. 7 and 8.

Figure 7:
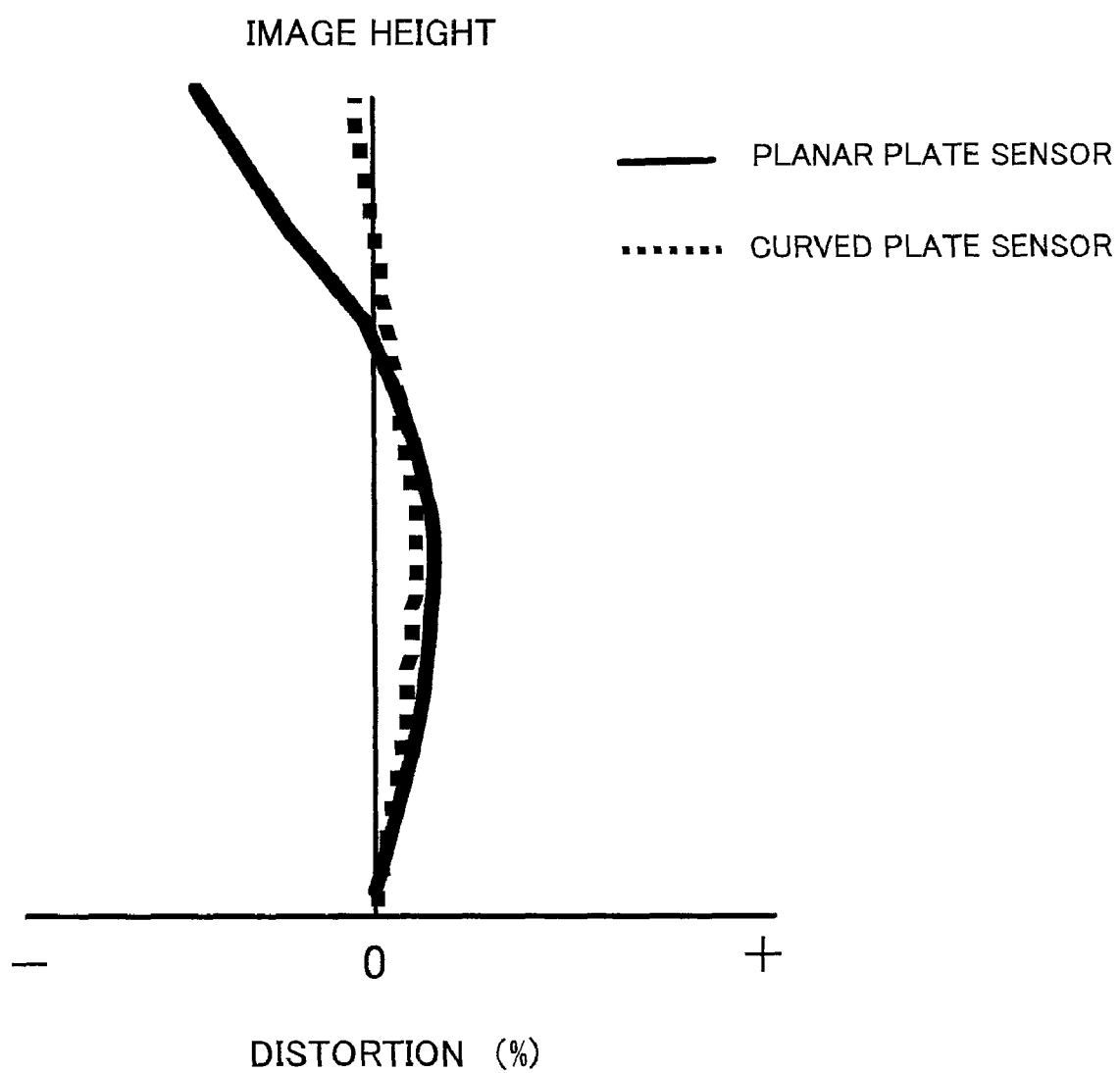
FIG. 7 is a graph showing image height-distortion characteristics of the imaging device according to the first embodiment of the present invention.

FIG. 7 is a graph showing a relationship between a distortion and a distance from the center of an image (hereinafter simply referred to as "image height"). A relationship expressed by a solid line is directed to the case that the center portion of the semiconductor imaging element 4 is curved and mounted on the tridimensional substrate 2. A relationship expressed by a dotted line is directed to the case that the center portion of the semiconductor imaging element 4 is mounted on the tridimensional substrate 2 without being curved.

As shown in FIG. 7, the semiconductor imaging element 4 curved and mounted on the tridimensional substrate 2 can take an image reduced in a distortion in comparison with an image taken by the semiconductor imaging element 4 mounted on the tridimensional substrate 2 without being curved.

Further, it is obvious that the curved semiconductor imaging element 4 can correct shading.

Figure 8:
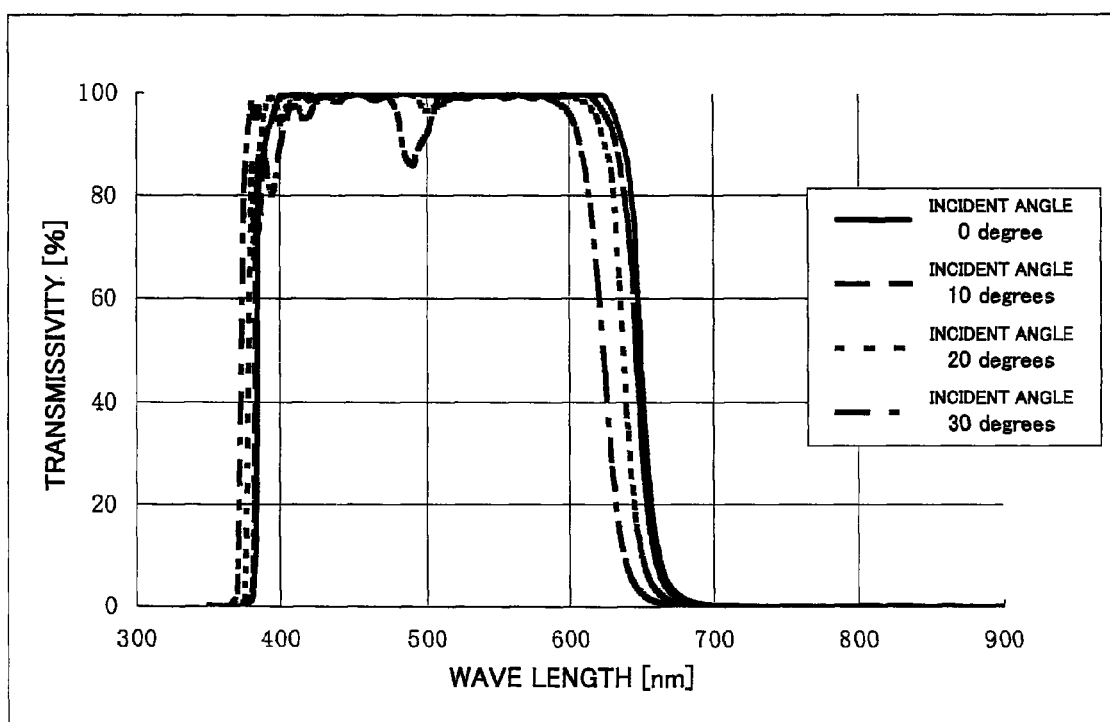
FIG. 8 is a graph showing wavelength-transmission characteristics of an optical filter of the imaging device according to the first embodiment of the present invention.

FIG. 8 is a graph showing spectral characteristic of the optical filter 5 used in this embodiment. The optical filter 5 functions as a band-pass filter by satisfying requirements that the transmissivity of the optical filter 5 is larger than 98% in a range from 400 nm to 650 nm, and the transmissivity of the optical filter 5 is sufficiently low in a range other than the visible range. However, the pass band of the optical filter 5 is shifted toward shorter wavelengths with increasing angle of incident light as shown in FIG. 8. Therefore, under the condition that the optical filter 5 is mounted on the tridimensional substrate 2 without being curved, light passed through the optical filter 5 is shifted toward shorter wavelengths in an area where the image height is large. Consequently, an image is tinged with blue, and reduced in color reproduction.

As well as the semiconductor imaging element 4, the optical filter 5 is mounted on the tridimensional substrate 2, and curved so that the center area of the optical filter 5 is far from the lens 3. Therefore, the incident angle of light from the object can be reduced in an area where the image height is large. As a result, the imaging device 1 according to the first embodiment of the present invention can be reduced in thickness, and can take an image improved in color reproduction at the periphery of the image.

Second Embodiment

The second embodiment of a mobile phone 30 according to the present invention will be described hereinafter with reference to FIG. 9.

Here, an imaging device 41 to be installed in the mobile phone 30 according to the second embodiment of the present invention is the same in construction as the imaging device 1 according to the first embodiment of the present invention, and will not described hereinafter.

Figure 9:
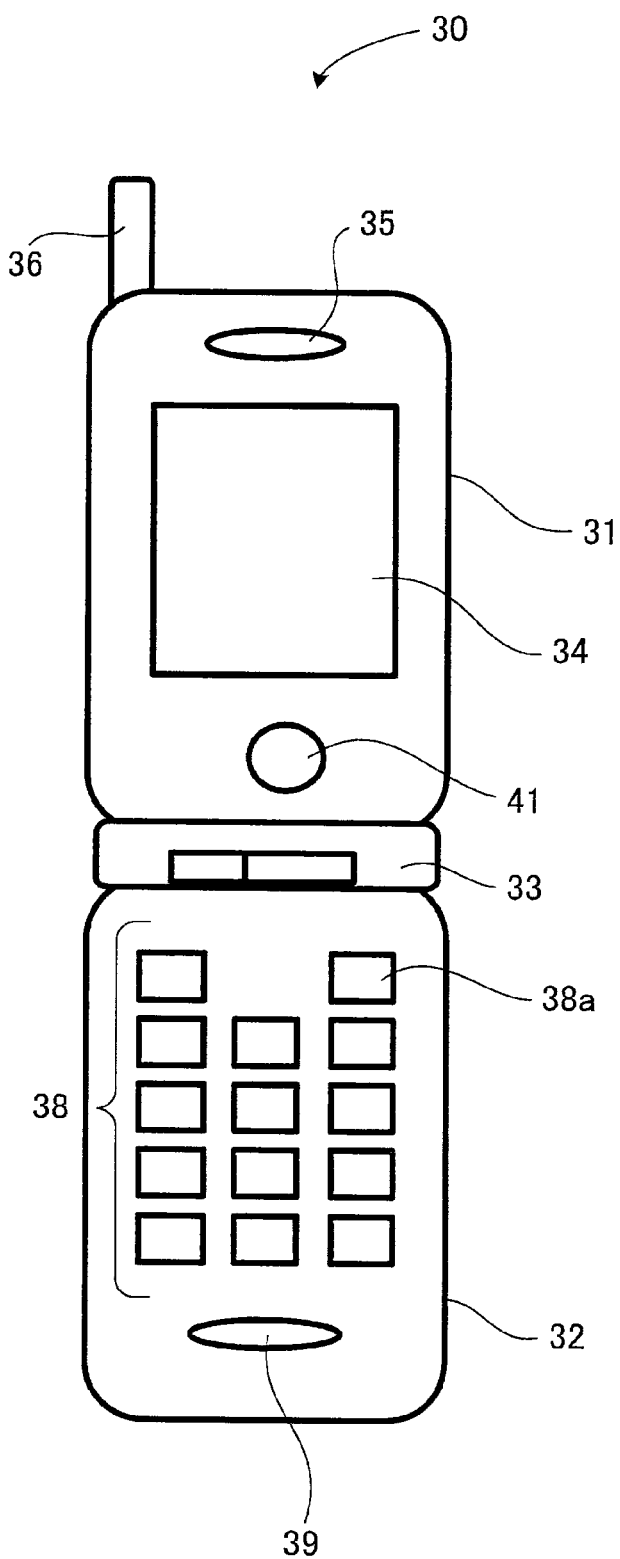
FIG. 9 is an elevation view of a mobile phone, which is in an opened state, according to the second embodiment of the present invention.

As shown in FIG. 9, a foldable mobile phone 30 includes an upper case 31, a lower case 32, and a hinge 33. In order to allow the mobile phone 30 to be opened and closed, the upper case 31 is connected to the lower case 32 through the hinge 33.

The upper case 31 has liquid crystal display 34, a loudspeaker 35, an antenna 36 for transmitting and receiving radio waves, and the imaging device 41 constituted as a camera for taking an image.

The lower case 32 has input keys 38 such as numeric keys, and a microphone 39. The input keys 38 include an imaging key 38a for activating the imaging device 41.

The imaging device 41 takes an image under the condition that the upper case 31 and the lower case 32 are unfolded with respect to each other (hereinafter referred to as "opened state").

When, for example, the imaging key 38a is pushed under the condition that the mobile phone 30 is in the opened state, the imaging device 41 is activated. When the imaging key 38a is pushed again, the imaging device 41 takes an image.

From the foregoing description, it will be understood that the upper case 31 can be reduced in thickness, and the mobile phone 30 according to the second embodiment of the present invention can take an image enhanced in color reproducibility and improved in distortion in a peripheral portion of the image. Therefore, two dimensional bar codes or the like can be read from an image taken by the imaging device 41 by reason that the periphery of the image is improved in distortion.

In this embodiment, the imaging device 41 is mounted on the mobile phone 30. However, the imaging device may be mounted on a personal digital assistant device (PDA), a personal computer, and an external mobile information device attached to a personal computer.

INDUSTRIAL APPLICABILITY

As will be seen from the foregoing description, the imaging device according to the present invention is improved in thickness, and has advantages that an image is enhanced in color reproducibility, and the peripheral portion of the image is reduced in distortion. The imaging device according to the present invention is useful as a camera mounted on a mobile terminal device such as a mobile phone.

The invention claimed is:

1. An imaging device comprising:
   a lens;
   an optical filter;
   a semiconductor imaging element having a light receiving section; and
   a substrate including a partition wall on which said semiconductor imaging element and said optical filter are mounted, wherein
   the thermal expansion coefficient of said substrate is greater than the thermal expansion coefficient of said optical filter, and the thermal expansion coefficient of said optical filter is greater than the thermal expansion coefficient of said semiconductor imaging element,
   said partition wall has an opening corresponding to said light receiving section of said semiconductor imaging element,
   said semiconductor imaging element and said optical filter are located on one side of said partition wall, while said lens is located on the other side of said partition wall,
   each peripheral portion of said semiconductor imaging element and said optical filter opposed to said lens is fixed to said substrate with an adhesive, and
   said semiconductor imaging element and said optical filter are curved so that respective centers thereof are deflexed in a direction away from said lens by a stress resulting from the difference between the thermal expansion coefficient of said substrate and respective thermal expansion coefficients of said semiconductor imaging element and said optical filter.

2. An imaging device according to claim 1, wherein said semiconductor imaging element and said optical filter are mounted on said substrate at a temperature higher than a normal operation temperature range.

3. An imaging device according to claim 1, wherein said optical filter has surfaces each provided with dielectric multilayer film.

4. An imaging device according to claim 1, wherein said semiconductor imaging element is mounted on the substrate on the basis of a flip chip bonding method.

5. An imaging device according to claim 1, wherein said partition wall includes a first planar section and a second planar section each surrounding said opening and provided on said one side of said partition wall,
   said peripheral portion of said optical filter opposed to said lens is fixed to said first planar section, and
   said peripheral portion of said semiconductor imaging element opposed to said lens is fixed to said second planar section.

6. An imaging device according to claim 1, wherein said optical filter and said semiconductor imaging element have substantially identical curved configuration.

7. A mobile phone comprising an imaging device as set forth in any one of claims 1, 2, 3, 4, 5, and 6.

* * * * *